United States Patent [19]
Aota et al.

[11] Patent Number: 5,291,453
[45] Date of Patent: Mar. 1, 1994

[54] SERIAL MEMORY APPARATUS HAVING UNITS FOR PRESETTING READING BIT LINES TO A GIVEN VOLTAGE

[75] Inventors: Hideyuki Aota, Toyonaka; Hiizu Okubo, Nishinomiya, both of Japan

[73] Assignee: Ricoh Company, Ltd., Tokyo, Japan

[21] Appl. No.: 17,843

[22] Filed: Feb. 16, 1993

[30] Foreign Application Priority Data

Feb. 19, 1992 [JP] Japan .................................. 4-031857
Aug. 27, 1992 [JP] Japan .................................. 4-228450

[51] Int. Cl.⁵ .............................................. G11C 7/00
[52] U.S. Cl. ................................... 365/221; 365/203; 365/230.03
[58] Field of Search ........... 365/219, 221, 203, 230.03, 365/239

[56] References Cited

U.S. PATENT DOCUMENTS 4,937,788  6/1990  Harada ............................. 365/221 X
5,029,135  7/1991  Okubo ............................. 365/203

FOREIGN PATENT DOCUMENTS 61-271683 12/1986 Japan .
1-137491  5/1989 Japan .

Primary Examiner—Joseph A. Popek
Attorney, Agent, or Firm—Cooper & Dunham

[57] ABSTRACT

A memory apparatus includes a memory cell array in which a plurality of memory cells are arranged in a matrix formation and divided into blocks, a writing part for serially writing data to the memory cell array through a set of writing bit lines, each of the writing bit lines connected to one of the blocks, a reading part for serially reading the data from the memory cells of the memory cell array through a set of reading bit lines, each of the reading bit lines connected to one of the blocks, and a set of precharging units each for presetting one of the reading bit lines to a prescribed voltage when data is read from one of the blocks of the memory cell array. In this apparatus, when a first reading cycle is carried out to read data from one memory cell of a first block and a second reading cycle is consecutively carried out to read data from one memory cell of a second block lying consecutively to the first block, one of the precharging units presets the reading bit line connected to the second block to the prescribed voltage during the first reading cycle before the data is read from the memory cell of the second block.

10 Claims, 6 Drawing Sheets

SERIAL MEMORY APPARATUS HAVING UNITS FOR PRESETTING READING BIT LINES TO A GIVEN VOLTAGE

BACKGROUND OF THE INVENTION

The present invention generally relates to a memory apparatus, and more particularly to a serial-access memory apparatus having precharging units, in which data is serially written to and read from a plurality of memory cells arranged in a matrix formation.

In digital processing systems, FIFO (first-in, first-out) memory devices are commonly used to store information (for example, digital image signals). FIG. 1 shows a FIFO memory device according to the prior art. The FIFO memory device shown in FIG. 1 includes a memory cell array 10 in which sixty-four memory cells MCmn (m=0, ..., 7; n=0, ..., 7), each of which stores 1-bit data, are arranged in an 8×8 matrix formation, a writing unit 20 for writing serial input data DI to the memory cell array 10, a write address pointer 21 for pointing to a specific location of the memory cell array 10 (a writing word line WWLn thereof) at which the serial input data DI is written, a reading unit 30 for reading out data DO from the memory cell array 10 and for serially outputting the data DO, and a read address pointer 31 for pointing to a specific location of the memory cell array 10 (a reading word line RWLn thereof) from which the output data DO is read out. In the reading unit 30 of the memory device, a memory sense amplifier (not shown in FIG. 1) senses the output levels of the memory cells of the memory cell array 10 and the measurement of the data in the memory cell array 10 is amplified.

When a reset signal RSTWB with a low level is input, the write address pointer 21 is initialized to reset the writing address of the memory cell array 10 to memory cell MC00. In synchronism with a writing clock WCK, which is input to the write address pointer 21 and the writing unit 20, the memory cell MCmn to which the first piece of the input data DI is written is selected, and the write address pointer 21 outputs a line select signal WBSm to the writing unit 20, the line select signal WBSm indicating the writing bit line WBLm of the memory cell array 10 at which the selected memory cell MCmn is located. Also, in synchronism with the writing clock WCK, the write address pointer 21 outputs a high-level signal to the writing word line WWLn connected to the memory cell MCmn of the memory cell array 10.

When a reset signal RSTRB with a low level is input, the read address pointer 31 is initialized to reset the reading address of the memory cell array 10 to the memory cell MC00. In synchronism with a reading clock RCK (which is input to the read address pointer 31 and the reading unit 30), the memory cell MCmn from which the start piece of the output data DO is read is selected, and the read address pointer 31 outputs a line select signal RBSm to the reading unit 30, the line select signal RBSm indicating the reading bit line RBLm of the memory cell array 10 at which the selected memory cell MCmn is located. Also, in synchronism with the reading clock RCK, the read address pointer 31 outputs a high-level signal to the reading word line RWLn connected to the memory cell MCmn of the memory cell array 10.

In the FIFO memory device described above, in order to quickly read out data from the FIFO memory device, a known precharging method has been used. In this precharging method, precharging units apply an electric voltage to the reading bit lines RBLm before data is read from the memory. For example, Japanese Laid-Open Patent Publication Nos. 1-137491 and 61-271683 disclose such precharging methods which are applied to the FIFO memory device.

FIG. 2 shows the operation of the conventional FIFO memory device shown in FIG. 1 including the above mentioned precharging units. Hereinafter, the term "leading edge of a signal" denotes a signal portion at which the signal changes from the low level to the high level, and "trailing edge of a signal" denotes a signal portion at which the signal changes from the high level to the low level.

In the FIFO memory device shown in FIG. 2, a precharge signal PRC is set to the high level before a reading cycle RCO in which data is read from the memory cell MCmn has started, and all the reading bit lines RBL0 to RBL7 connected to the memory cell array 10 are preset to a prescribed voltage. After a reading clock RCK changes from the low level to the high level, the high-level precharge signal PRC changes to the low level, so that all the precharging of the eight reading bit lines is completed. In response to the trailing edge of the precharge signal PRC, the signal, output from the read address pointer 31 to the reading word line RWLn, changes from the low level to the high level. In response to the leading edge of this signal, the data from the memory cell MCmn connected to the reading word line RWLn is output to the reading bit line RBLm. One of the eight reading bit lines RBL0 to RBL7 is selected by the bit line select signal RBSm from the read address pointer 31. The voltage of the selected bit line is sensed and amplified by the memory sense amplifier of the reading unit 30, so that the output data DO is read out by the reading unit 30. After a sensing end signal appears, the signal output to the reading word line RWLn is reset to the low level. In response to the trailing edge of the reading word line signal, a leading edge of the precharge signal PRC appears so that the precharging of the eight reading bit lines RBL0 to RBL7 is performed in order to serially read out data from the memory cell array 10. In other words, when the reading word line signal changes to the low level, the precharge signal changes to the high level for precharging the eight reading bit lines, and then data is read from the next memory cell MC(m+1)n.

Therefore, in the conventional memory device described above, it is necessary to precharge all the reading bit lines RBL0–RBL7 to the prescribed voltage for reading out data from one of the memory cells of the memory cell array. Also, the conventional memory device uses a relatively large amount of electric power for reading out the data. Thus, for each reading cycle, the conventional memory device requires the access time for reading out the data as well as the precharging time for precharging all the reading bit lines, and the total reading time is relatively long.

SUMMARY OF THE INVENTION

Accordingly, it is a general object of the present invention to provide an improved serial-access memory apparatus in which the above described problems are eliminated.

Another, more specific object of the present invention is to provide a serial-access memory apparatus in which data can be read out from a serial-access memory at an increased reading rate by using a read cycle time shorter than that of the conventional memory device and by using a relatively small amount of electric power for reading out the data in comparison with the conventional memory device. The above mentioned object of the present invention is achieved by a serial-access memory apparatus which includes a memory cell array in which a plurality of memory cells are arranged in an m×n matrix formation and divided into "m" blocks each of which includes a set of "n" memory cells, a writing part for serially writing data to the memory cells of the memory cell array through a set of writing bit lines, each of the writing bit lines being connected to one of the blocks of the memory cell array, a reading part for serially reading the data from the memory cells of the memory cell array through a set of reading bit lines, each reading bit line connected to one of the blocks of the memory cell array, and a precharging part for presetting one of the reading bit lines to a prescribed voltage when data is read from one of the blocks of the memory cell array. In this apparatus, when a first reading cycle is carried out to read data from one memory cell of a first block and a second reading cycle is carried out consecutively to the first reading cycle, to read data from one memory cell of a second block lying consecutively to the first block, the precharging part presets one reading bit line connected to the second block to the prescribed voltage during the first reading cycle before the data is read from the memory cell of the second block. According to the present invention, it is possible to read out data from the memory cell array at an increased reading rate by using a shorter read cycle time and a smaller amount of electric power in comparison with the conventional memory device.

Other objects and further features of the present invention will become apparent from the following detailed description when read in conjunction with the accompanying drawings.

DESCRIPTION OF THE PREFERRED EMBODIMENT

A description will now be given of a preferred embodiment of the serial-access memory apparatus according to the present invention, with reference to FIGS. 3 through 5.

Figure 3:
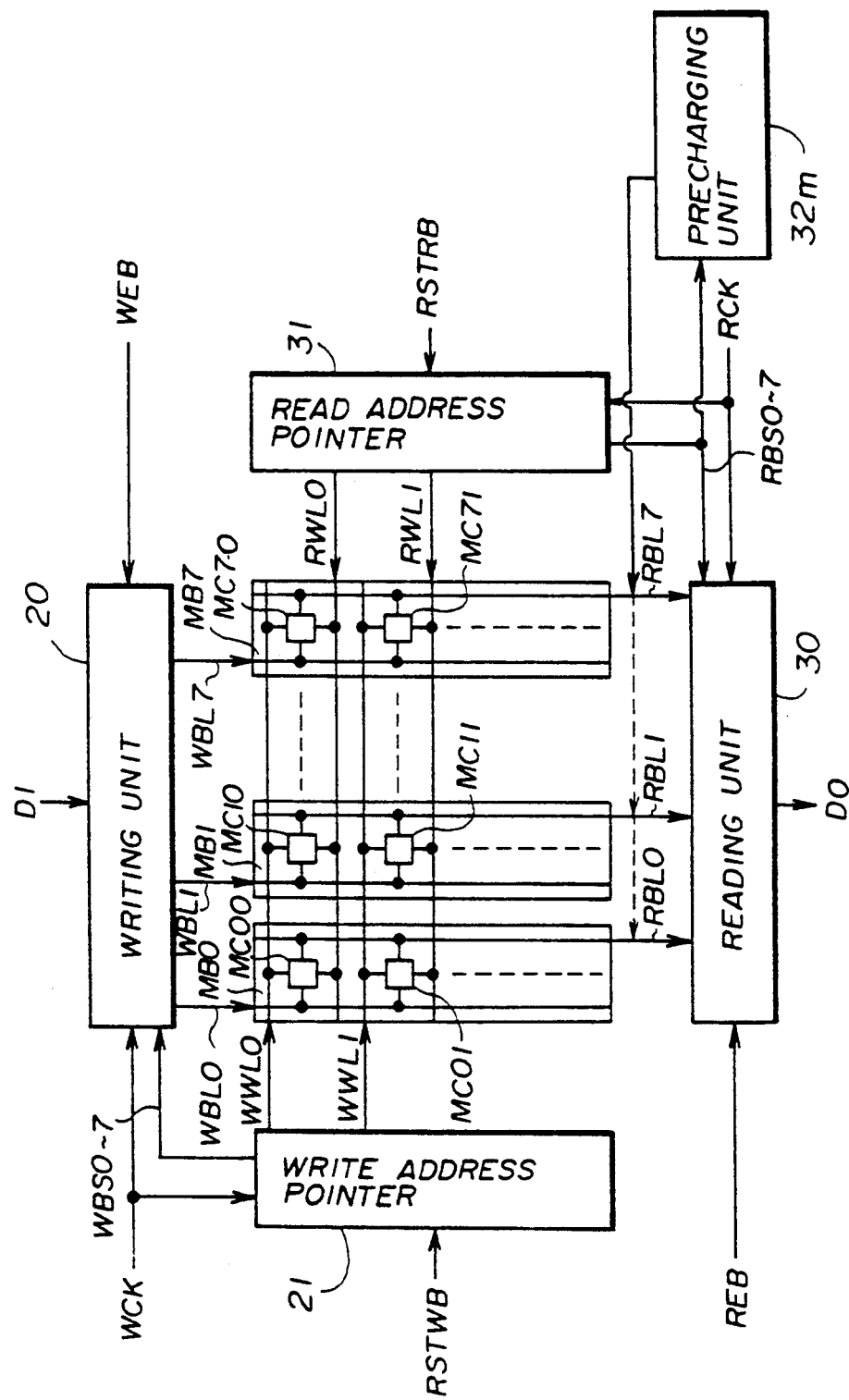
FIG. 3 is a block diagram showing a preferred embodiment of a serial-access memory apparatus according to the present invention.

FIG. 3 shows a serial-access memory apparatus according to the present invention. FIG. 4 shows a precharging unit $32m$ (m=0) for presetting a reading bit line RBL0 of the apparatus shown in FIG. 3 to a prescribed voltage. FIG. 5 shows one of seven precharging units $32m$ for presetting seven reading bit lines RBLm (m=1, ..., 7) of the apparatus shown in FIG. 3 to a prescribed voltage. The serial-access memory apparatus of the the present invention includes the eight precharging units $32m$ shown in FIGS. 4 and 5.

As shown in FIG. 3, the serial-access memory apparatus includes a memory cell array in which sixty-four memory cells MCmn (m=0, ..., 7: n=0, ..., 7) each of which stores 1-bit information are arranged in an 8×8 matrix formation. This memory cell array is divided into eight memory blocks MB0 to MB7 each of which includes eight memory cells. Thus, one of the eight memory blocks MBm (M=0, ..., 7) of the memory cell array includes eight memory cells MCm0 to MCm7. Each of the eight memory blocks MBm is connected to the writing unit 20 via one of eight writing bit lines WBLm and connected to the reading unit 30 via one of eight reading bit lines RBLm.

Figure 4:
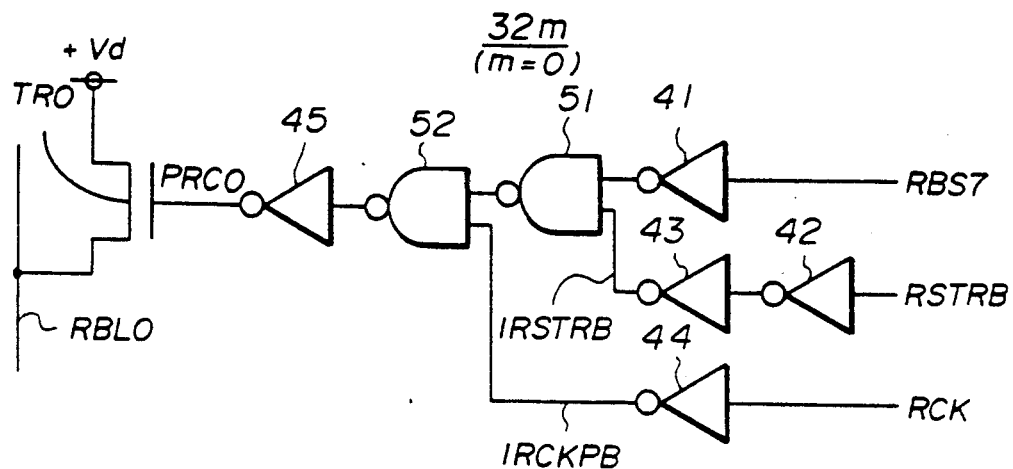
FIG. 4 is a diagram showing a precharging unit for presetting a reading bit line RBL0 of the apparatus shown in FIG. 3 to a prescribed voltage.
Figure 5:
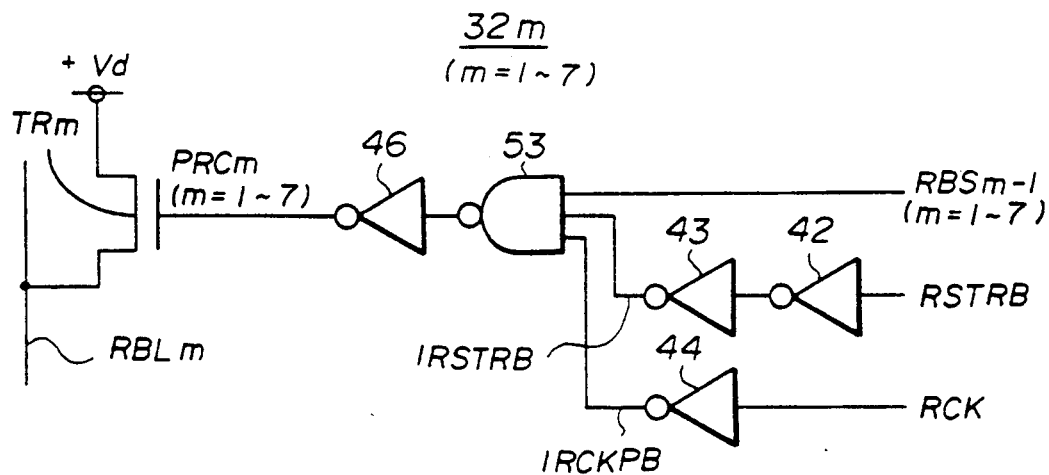
FIG. 5 is a diagram showing one of seven precharging units for presetting seven reading bit lines of the apparatus to a prescribed voltage.

During a reading cycle in which data is read from one of the memory cells MC(m−1)n connected to the reading bit line RBL(m−1), one of the precharging units, as shown in FIG. 5, presets the reading bit line RBLm to a prescribed high-level voltage in accordance with the high-level bit line select signal RBS(m−1) corresponding to the reading bit line RBL(m−1) preceding the thus preset reading bit line RBLm, when no reset signal with the low level is input to the read address pointer 31. When a low-level reset signal RSTRB is input to the read address pointer 31, the reading unit 30 and the read address pointer 31 are initialized to set the reading address of the memory cell array to the memory cell MC00. When the reading unit 30 and the read address pointer 31 are initialized by the reset signal, the precharging unit $32m$ (m=0) shown in FIG. 4 presets the reading bit line RBL0, connected to the memory cell MC00, to the prescribed high-level voltage in accordance with the high-level bit line select signal RBS7 corresponding to the reading bit line RBL7 preceding the thus preset reading bit line RBL0.

Figure 1:
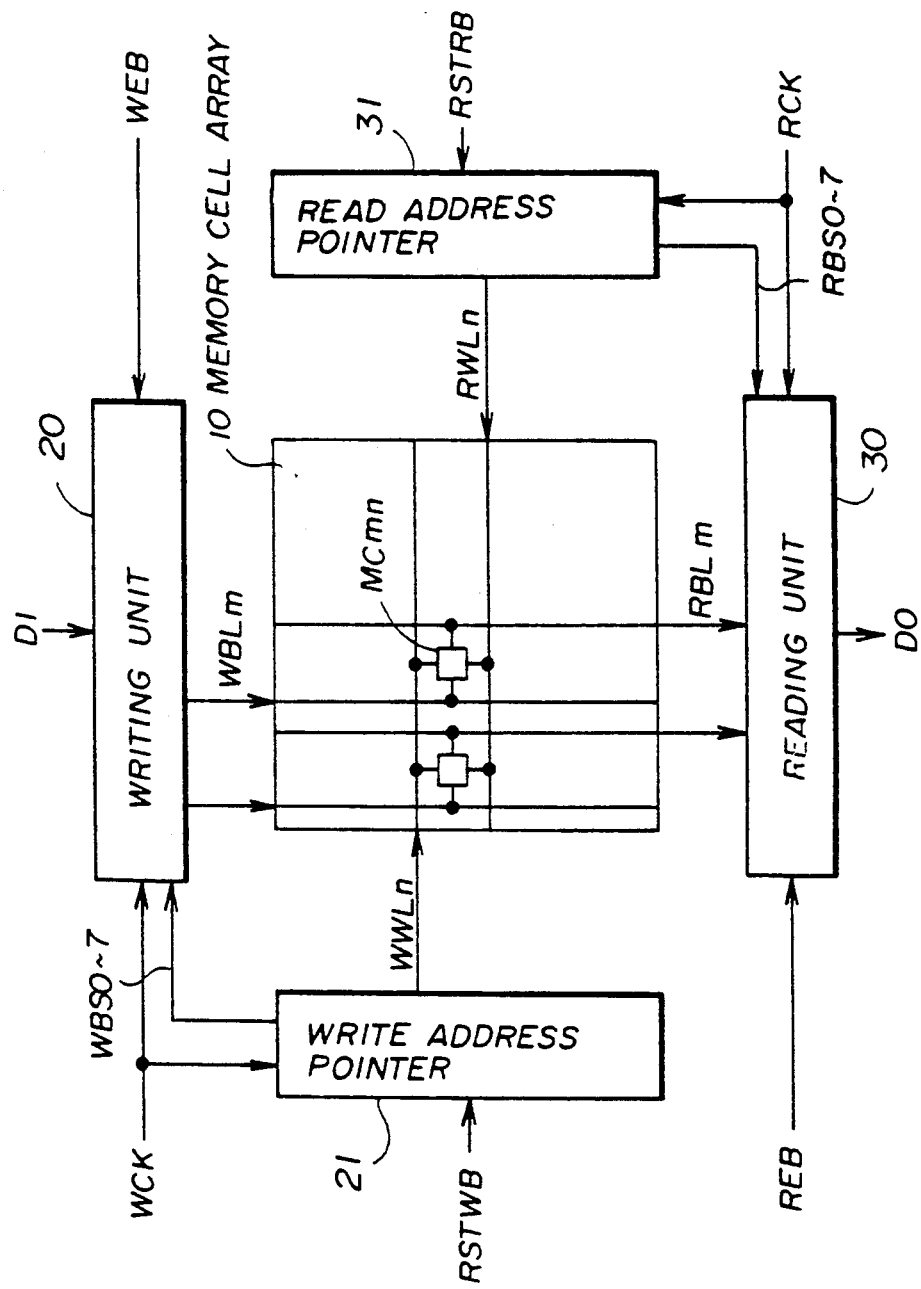
FIG. 1 is a block diagram showing a FIFO memory device according to the prior art.
Figure 2:
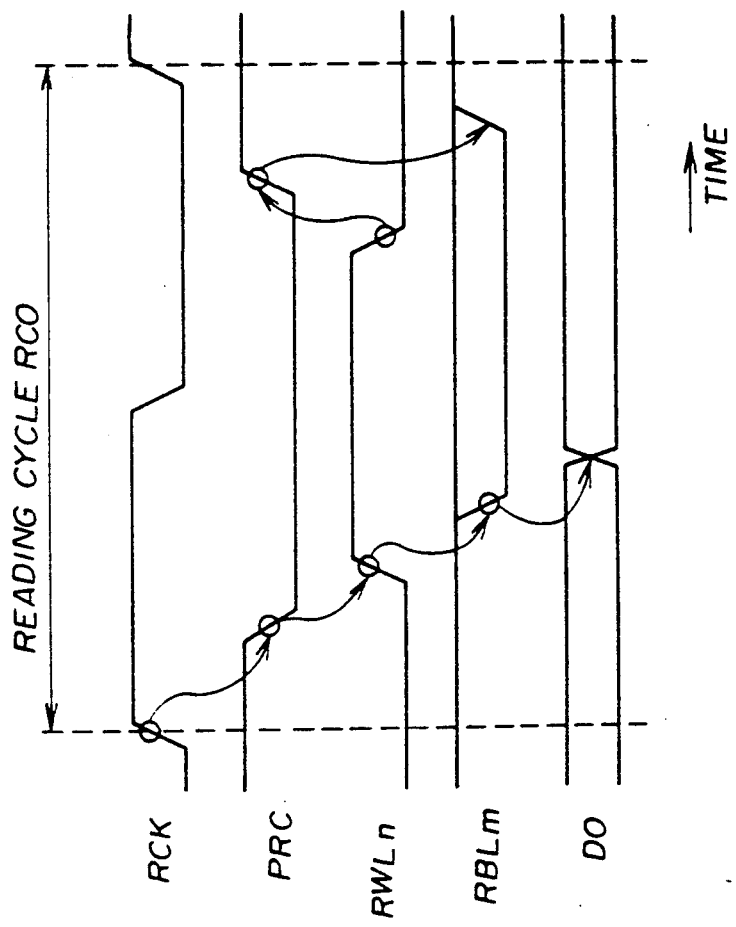
FIG. 2 is a timing chart for explaining operations of the FIFO memory device shown in FIG. 1.

In the serial-access memory apparatus shown in FIG. 3, the writing unit 20, the write address pointer 21, the reading unit 30, and the read address pointer 31 which are the same as the corresponding parts of the conventional device shown in FIG. 1 are designated by the same reference numerals, and a description thereof will be omitted. Also, in the serial-access memory apparatus shown in FIG. 3, the signals are input to the respective parts of the apparatus in the same manner as in the conventional device shown in FIG. 1 as described above.

In order to preset the reading bit line RBL0 to a prescribed voltage, the precharging unit $32m$ (m=0) shown in FIG. 4 is coupled to the reading bit line RBL0 of the apparatus shown in FIG. 3. As shown in FIG. 4, a bit line select signal RBS7 is input to a first terminal of a NAND circuit 51 via an inverter 41. This bit line select signal RBS7 is used to select the reading bit line RBL7 preceding the thus preset reading bit line RBL0 in the apparatus shown in FIG. 3. A reset signal RSTRB (input to the read address pointer 31) is converted by two inverters 42 and 43 to a signal IRSTRB, and this signal IRSTRB is input to a second terminal of the NAND circuit 51. The output signal of the NAND circuit 51 is input to a first terminal of a NAND circuit 52. The reading clock RCK is converted by an inverter 44 to a signal IRCKPB, and this signal IRCKPB is input to a second terminal of the NAND 52. The output signal of the NAND circuit 52 is converted by an inverter 45 to a precharge signal PRC0. This precharge signal PRC0 is input to the gate of an n-channel field effect transistor (FET) TR0. A prescribed voltage Vd from a power supply is applied to the drain of the transistor TR0, and the reading bit line RBL0 is connected to the source of the transistor TR0.

In order to preset the reading bit line RBLm to a prescribed voltage, each of the seven precharging units $32m$ ($m=1, \ldots, 7$) shown in FIG. 5 is coupled to one of the seven reading bit lines RBLm ($m=1, \ldots, 7$) of the apparatus shown in FIG. 3. As shown in FIG. 5, the bit line select signal RBS($m-1$) is input to a first terminal of a NAND circuit 53. This bit line select signal RBS($m-1$) is used to select the reading bit line RBL($m-1$) preceding the reading bit line RBLm, in order to read the data from one of the memory cells of the memory block MC($m-1$). A reset signal RSTRB is converted by two inverters 42 and 43 to a signal IRSTRB, and this signal IRSTRB is input to a second terminal of the NAND circuit 53. The reading clock RCK is converted by an inverter 44 to a signal IRCKPB, and this signal IRCKPB is input to a third terminal of the NAND circuit 53. The output signal of the NAND circuit 53 is converted by an inverter 46 to a precharge signal PRCm ($m=1, \ldots, 7$). This precharge signal PRCm is input to the gate of an n-channel field effect transistor (FET) TRm ($m=1, \ldots, 7$). A prescribed voltage Vd from a power supply is applied to the drain of the transistor TRm, and the reading bit line RBLm is connected to the source of the transistor TRm.

Next, with reference to FIGS. 6 and 7, operations of the memory apparatus having the eight precharging units described above will be described.

Figure 6:
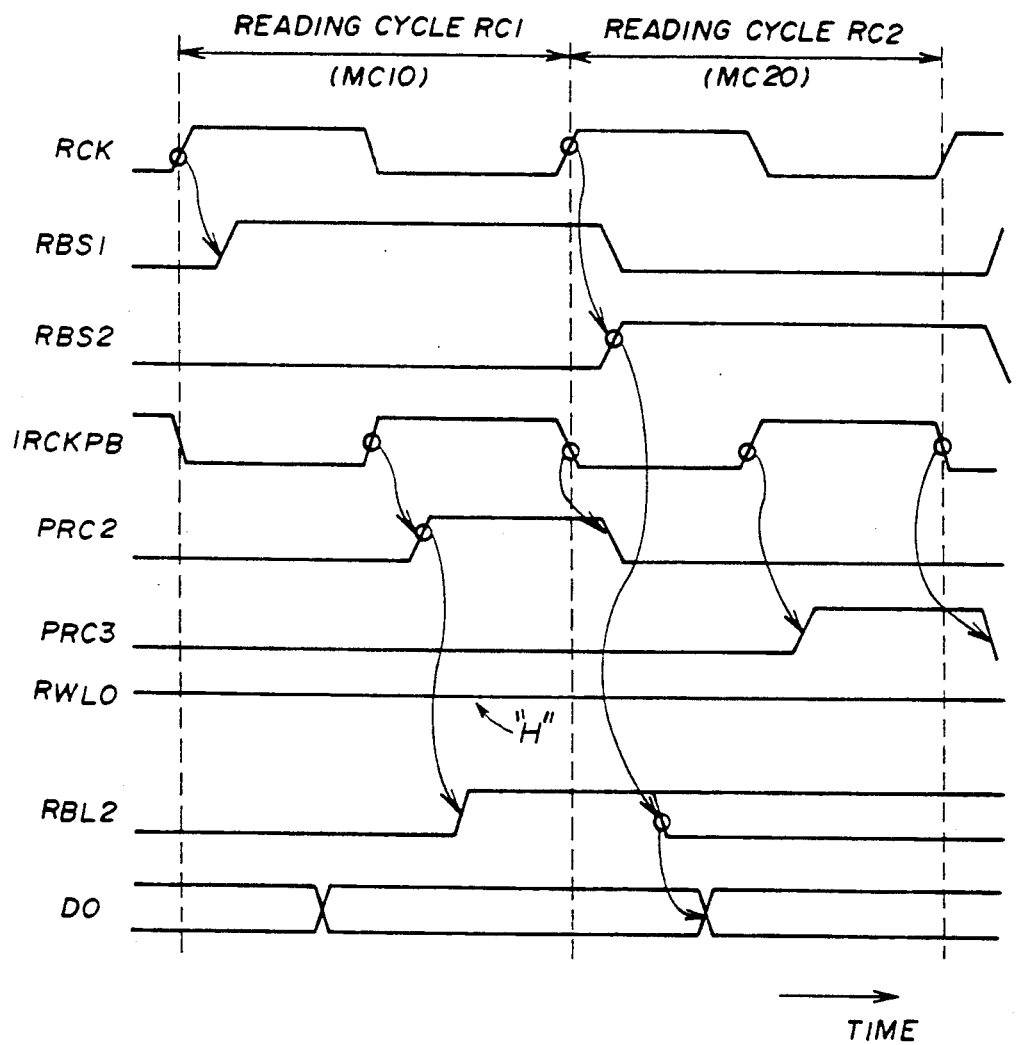
FIG. 6 is a timing chart for explaining operations of the apparatus having the precharging units shown in FIGS. 3 to 5 when no reset signal is input.

FIG. 6 shows typical operations of the serial-access memory apparatus including the precharging units $32m$ shown in FIG. 5 when no reset signal RSTRB is input to the read address pointer 31. In the operations of the serial-access memory apparatus shown in FIG. 6, a reading cycle RC1 in which data is read out from the memory cell MC10 is carried out and a read cycle RC2 in which data is read out from the memory cell MC20 is carried out consecutively after the reading cycle RC1 is completed.

In the reading cycle RC1 shown in FIG. 6, after a leading edge of the reading clock RCK is input, the bit line select signal RBS1 changes from the low level to the high level. The high-level bit line select signal RBS1 is input to the reading unit 30 so that data is read out from the memory cell MC10 of the memory block MB1. When the reading clock RCK changes to the low level, the signal IRCKPB changes from the low level to the high level. In response to the leading edge of the signal IRCKPB, the precharge signal PRC2 changes from the low level to the high level. This signal PRC2 at this time is the only signal that is set to the high level among the eight precharge signals PRC0 to PRC7. In response to the high-level precharge signal PRC2, the reading bit line RBL2, connected to the eight memory cells MC2n ($n=0, \ldots, 7$) of the memory block MB2, is preset to the high-level voltage Vd.

In the next reading cycle RC2 shown in FIG. 6, after a leading edge of the reading clock RCK is input, the high-level bit line select signal RBS1 changes to the low level, and the bit line select signal RBS2 changes from the low level to the high level. The high-level bit line select signal RBS2 is input to the reading unit 30 so that 1-bit data is read out from the memory cell MC20 of the memory block MB2. The voltage of the reading word line RWL0 at this time remains at the high level. In the reading unit 30, the voltage of the reading bit line RBL2 is sensed and amplified by the memory sense amplifier so that the output data DO corresponding to the voltage of the reading bit line RBL2 is output by the reading unit 30.

When the reading clock RCK changes to the low level, the signal IRCKPB changes from the low level to the high level. In response to the leading edge of the signal IRCKPB, the precharge signal PRC3 changes from the low level to the high level. This signal PRC3 at this time is the only signal that has the high level among the eight precharge signals PRC0 to PRC7. The reading bit line RBL3, connected to the eight memory cells MC3n ($n=0, \ldots, 7$) of the memory block MB3, is preset to the high-level voltage Vd.

Figure 7:
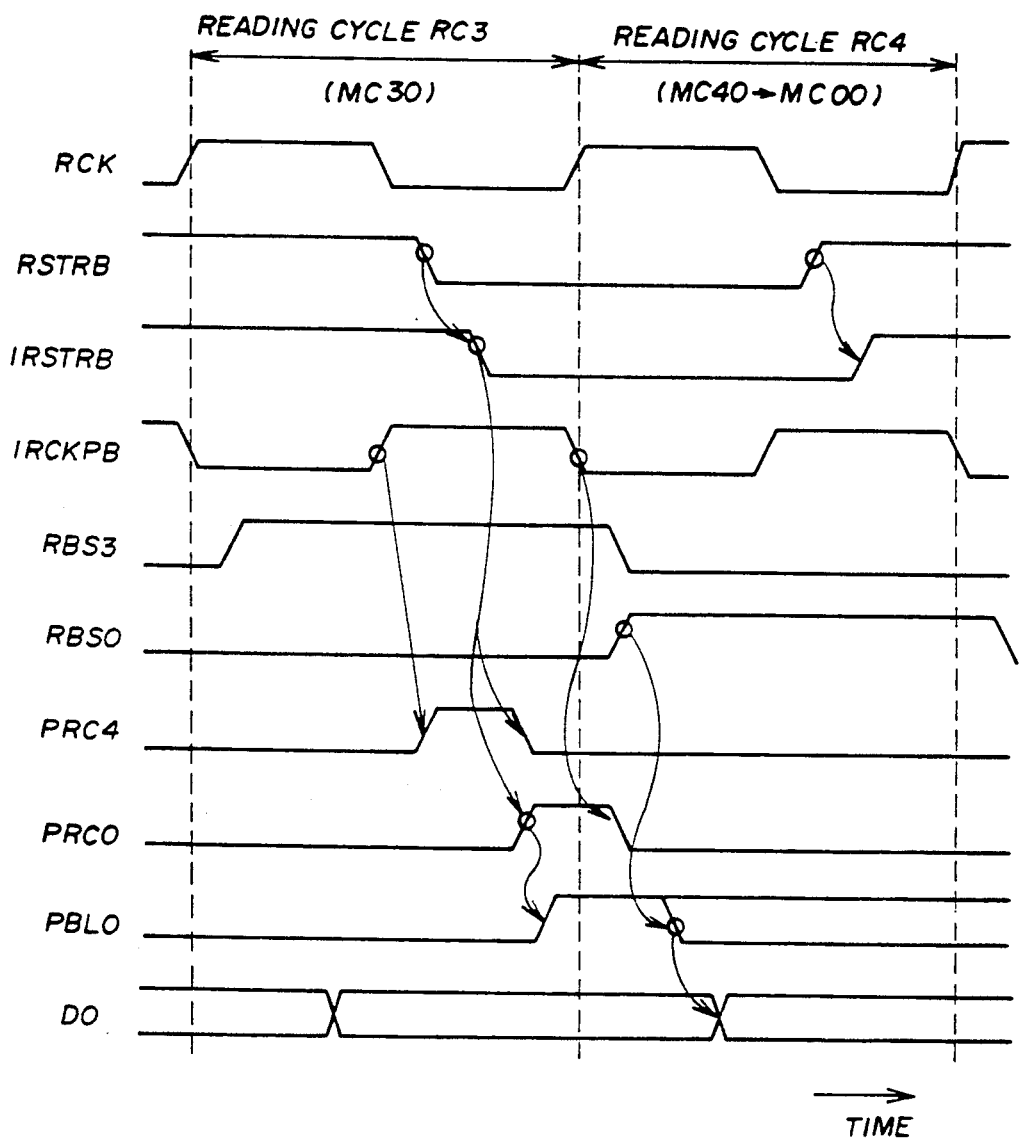
FIG. 7 is a timing chart for explaining operations of the apparatus having the precharging units shown in FIGS. 3 to 5 when a reset signal is input.

FIG. 7 shows typical operations of the serial-access memory apparatus having the eight precharging units $32m$ shown in FIGS. 4 and 5 when a reset signal RSTRB is input to the read address pointer 31. In the memory apparatus operations shown in FIG. 7, a reading cycle RC3 in which data is read out from the memory cell MC30 is carried out, and a reading cycle RC4 is carried out consecutively after the reading cycle RC3 is completed In the reading cycle RC4, an operation to read out data from the memory cell MC40 is changed to an operation to read out data from the memory cell MC00 due to the input reset signal RSTRB.

As shown in FIG. 7, the high-level reset signal RSTRB changes to the low level during the operation of reading data from the memory cell MC30, and this low-level reset signal RSTRB is input to the read address pointer 31. When the low-level reset signal RSTRB is input, the high-level signal IRSTRB changes to the low level. It is initially intended to read data from the memory cell MC40 in the reading cycle RC4, and the precharge signal PRC4 has already changed to the high level for presetting the reading bit line RBL4 to the prescribed voltage. However, in response to the trailing edge of the signal IRSTRB, the high-level precharge signal PRC4 changes to the low level so that the precharging of the reading bit line RBL4 is stopped. In response to the trailing edge of the signal IRSTRB, a precharge signal PRC0 changes from the low level to the high level, so that the reading bit line RBL0 is preset to the prescribed high-level voltage in order to read out data from the memory cell MC00.

Accordingly, in the case of the reading cycle RC4 shown in FIG. 7, the operation to read data from the newly changed memory cell MC00 is carried out in the same manner as described in conjunction with FIG. 6. When a low-level reset signal RSTRB is input to the read address pointer 31 before the data is read out from the memory cell MC30 in the reading cycle RC3, the operation which is the same as described above is carried out.

In the embodiment of the serial-access memory apparatus described above, one of the precharging units shown in FIGS. 4 and 5 presets one of the eight reading bit lines RBL0 to RBL7 to the prescribed voltage before the data is read from one of the memory cells of the memory block connected to the preceding reading bit line. Thus, it is possible to use a smaller amount of electric power for reading the data from the memory cell array in comparison with the conventional device. In addition, in the above described embodiment, the precharging of the reading bit line needed for the following reading cycle is performed during the preceding reading cycle. Thus, the total read cycle time of the apparatus according to the present invention required for reading 1-bit data from one memory cell can be reduced in comparison with that of the conventional device. Therefore, it is possible to read out data from the memory cell array at an increased reading rate by using a shorter read cycle time and a smaller amount of electric power in comparison with the conventional memory device.

In the foregoing, the embodiment of the FIFO memory device has been described. However, the present invention is also applicable to other serial memory devices in which data is serially written to and read from the data storage elements.

Further, the present invention is not limited to the above described embodiment, and variations and modifications may be made without departing from the scope of the present invention.

What is claimed is:

1. A memory apparatus for serially writing data to a plurality of memory cells, arranged in a matrix formation, and for serially reading the data from the memory cells, said apparatus comprising:
   a memory cell array in which a plurality of memory cells are arranged in an m×n matrix formation and divided into "m" blocks each of which includes a set of "n" memory cells;
   writing means for serially writing data to said memory cells of said memory cell array through a set of writing bit lines, each of said writing bit lines being connected to one of said blocks of said memory cell array;
   reading means for serially reading the data from said memory cells of said memory cell array through a set of reading bit lines, each of said reading bit lines being connected to one of said blocks of said memory cell array; and
   a set of precharging means each for presetting one of said reading bit lines to a prescribed voltage when data is read by said reading means from one of said blocks of said memory cell array,
   wherein when a first reading cycle is carried out to read data from one memory cell of a first block among said blocks of said memory cell array and a second reading cycle is carried out consecutively to the first reading cycle to read data from one memory cell of a second block lying consecutively to said first block in said memory cell array, one of said precharging means presets one reading bit line, connected to said second block, to the prescribed voltage during said first reading cycle before the data is read from the memory cell of the second block.

2. A memory apparatus according to claim 1, wherein one of said precharging means presets the reading bit line connected to said second block to the prescribed voltage when a bit line select signal used to select the reading bit line connected to said first block is input.

3. A memory apparatus according to claim 1, wherein one of said precharging means presets one reading bit line, connected to a predetermined block among the blocks of the memory cell array, to the prescribed voltage when a reset signal used to initialize said reading means is input.

4. A memory apparatus according to claim 1, wherein when a bit line select signal used to select the reading bit line connected to said first block is input during said first reading cycle and a reset signal used to initialize said reading means is input after said bit line select signal is input, one of said precharging means presets one reading bit line, connected to a predetermined block among the blocks of the memory cell array, to the prescribed voltage.

5. A memory apparatus according to claim 1, wherein said precharging means comprises a first precharging unit coupled to a predetermined first reading bit line and a set of second precharging units respectively coupled to the other reading bit lines, said first precharging unit presetting said first reading bit line, corresponding to a predetermined block among the blocks of the memory cell array, to the prescribed voltage when a reset signal used to initialize said reading means is input.

6. A memory apparatus according to claim 1, wherein said precharging means comprises a first precharging unit coupled to a predetermined first reading bit line and a set of second precharging units respectively coupled to the other reading bit lines, one of said second precharging units presetting the reading bit line connected to said second block to the prescribed voltage when a bit line select signal used to select the reading bit line connected to said first block is input.

7. A memory apparatus according to claim 1, wherein said precharging means comprises a first precharging unit coupled to a predetermined first reading bit line and a set of second precharging units respectively coupled to the other reading bit lines, and wherein when a bit line select signal used to select the reading bit line connected to said first block is input during said first reading cycle and a reset signal used to initialize said reading means is input after said bit line select signal is input, said first precharging unit presets said first reading bit line, corresponding to a predetermined block among the blocks of the memory cell array, to the prescribed voltage.

8. A memory apparatus according to claim 1, wherein said writing means comprises a writing unit coupled to the set of writing bit lines and a write address pointer coupled to said writing unit, and wherein a bit line select signal used to select one writing bit line from among the writing bit lines is input from the write address pointer to the writing unit.

9. A memory apparatus according to claim 1, wherein said reading means comprises a reading unit coupled to the set of reading bit lines and a read address pointer coupled to said reading unit, and wherein a bit line select signal used to select one reading bit line from among the reading bit lines is input from the read address pointer to the reading unit.

10. A memory apparatus according to claim 9, wherein one of said precharging means presets the reading bit line connected to said second block to the prescribed voltage when the bit line select signal used to select the reading bit line connected to said first block is input from the read address pointer to the reading unit.

* * * * *